United States Patent [19]
Krauter et al.

[11] Patent Number: 4,776,314
[45] Date of Patent: Oct. 11, 1988

[54] SWITCHING CIRCUIT FOR CONTROLLING THE CURRENT THROUGH AN ELECTRICAL CONSUMER, IN PARTICULAR ELECTROMAGNETIC CONSUMER

[75] Inventors: Immanuel Krauter, Erbstetten; David Van Belzen, Hemmingen, both of Fed. Rep. of Germany

[73] Assignee: Robert Bosch GmbH, Stuttgart, Fed. Rep. of Germany

[21] Appl. No.: 871,421
[22] PCT Filed: Sep. 20, 1985
[86] PCT No.: PCT/DE85/00326
§ 371 Date: May 2, 1986
§ 102(e) Date: May 2, 1986
[87] PCT Pub. No.: WO86/02127
PCT Pub. Date: Apr. 10, 1986

[30] Foreign Application Priority Data
May 10, 1984 [DE] Fed. Rep. of Germany ....... 3436456

[51] Int. Cl.$^4$ .......................... F02D 5/00; G05F 1/58
[52] U.S. Cl. ...................................... 123/490; 361/153
[58] Field of Search ................ 123/490; 361/152, 153, 361/154, 155, 156

[56] References Cited
U.S. PATENT DOCUMENTS

| | | | |
|---|---|---|---|
| 4,328,526 | 5/1982 | Dilger et al. | 123/490 X |
| 4,454,558 | 6/1984 | Huddart | 361/153 |
| 4,485,342 | 11/1984 | Hill et al. | 361/153 X |
| 4,492,913 | 1/1985 | Arnold et al. | 123/490 X |

Primary Examiner—Willis R. Wolfe, Jr.
Attorney, Agent, or Firm—Michael J. Striker

[57] ABSTRACT

A switching circuit is suggested for controlling the current through an electrical consumer, in particular an electromagnetic consumer (10), whereby a field effect transistor (11) is used as a control and current measuring member being series connected to the consumer. The field effect transistor is brought into the conductive condition with the assistance of a controlling device, such as an operational amplifier which in turn is immediately controlled by switching-on enforcing means when the field effect transistor is short-circuited with respect to a power source. The switching-on enforcing means comprise a capacitor, for example.

7 Claims, 1 Drawing Sheet

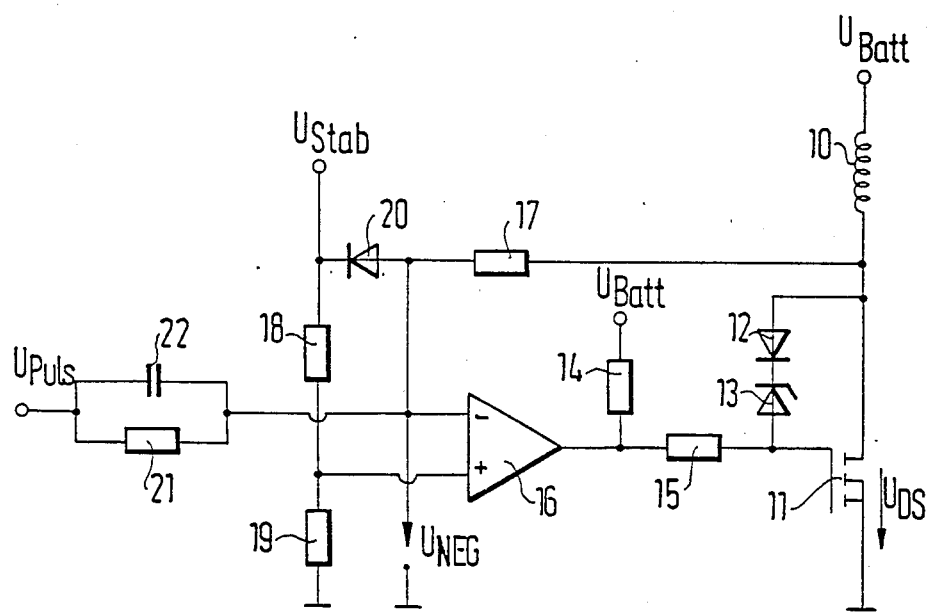

SWITCHING CIRCUIT FOR CONTROLLING THE CURRENT THROUGH AN ELECTRICAL CONSUMER, IN PARTICULAR ELECTROMAGNETIC CONSUMER

STATE OF THE ART

The invention relates to a switching circuit for controlling the current through a consumer in accordance with the type of the preamble of the main claim.

A current controlled end stage for electromagnetic consumers is known from U.S. Pat. No. 4,492,913, whereby a field effect transistor assumes the function of the switching and the current measuring. Thereby, the voltage is simulated with the assistance of a capacitor which is connected parallel to the field effect transistor in accordance with the described exemplified embodiment.

It now had been shown that the described circuit does not provide an optimum behavior in conjunction with its resistance against short circuiting. For example, during a through switched field effect transistor and a sudden short circuit of the field effect transistor to the battery voltage a much too long reaction time of the circuit results until the switching off of the field effect transistor, so that the same is thermically severely overloaded.

ADVANTAGES OF THE INVENTION

In contrast to the described state of the art the switching circuit, in accordance with the invention, for controlling the current through an electrical consumer, in particular an electromagnetic consumer with the features of the main claim is advantageous in that substantially shorter reaction times are possible in the switching circuit after short circuits. This is obtained in accordance with the invention that the switching circuit can feed a current through the electrical consumer only with the assistance of a forced switching on.

Thereby, it is particularly advantageous to realize the forced switching on by means of a capacitor. Further advantageous embodiments and improvements of the device stated in the main claim in accordance with the invention are made possible by the measures stated in the subclaims.

DRAWING

One exemplified embodiment of the invention is illustrated in the drawing and explained in detail in the following description. The single FIGURE in the drawing illustrates a diagram of the switching circuit in accordance with the invention.

DESCRIPTION OF THE EXEMPLIFIED EMBODIMENT

The described exemplified embodiment relates to a switching circuit for controlling the current through an electrical consumer. In particular, the switching circuit in accordance with the invention is suitable for controlling and/or regulating the current through an electromagnetic consumer, for example, a magnetic valve. The described switching circuit may be used, for example, in conjunction with internal combustion engines, in particular during the injection of the fuel into the combustion chamber of the internal combustion engine with the assistance of a magnetic valve. However, in principal the switching circuit in accordance with the invention is not limited to these specific applications, but may be used in all cases where rapid reactions are required with respect to short circuits and overloads.

The single FIGURE of the drawing illustrates a realisation of the switching circuit in accordance with the invention. An electromagnetic consumer 10 and a field effect transistor 11 form a series circuit, whereby the electromagnetic consumer 10 is connected to a battery voltage $U_{Batt}$ and the field effect transistor 11 to ground. It is also possible to use a bipolar transistor instead of the field effect transistor. From the connecting point of the electromagnetic consumer 10 and the field effect transistor 11, a series circuit of a diode 12 and a reversely connected Zener diode 13 leads to the control terminal of the field effect transistor 11. A resistor 14 is connected with the battery voltage $U_{Batt}$ and through a further resistor 15 with the mentioned control terminal of the field effect transistor 11, the connection point of resistors 14 and 15 is connected with the output of an operation amplifier 16. From the connecting point of the electromagnetic consumer 10 and the field effect transistor 11 a feedback resistor 17 is connected to the inverting input of the operation amplifier 16. The series circuit of two voltage divider resistors 18 and 19 is disposed between a stabilised voltage $U_{stab}$ and ground. The connecting point of the two voltage divider resistors 18 and 19 is connected with the noninverting input of the operation amplifier 16. The resistor 17 which is connected to the inverting input of the operation amplifier 16 is also connected with the stabilised voltage $U_{stab}$ by means of a diode 20. Finally, the parallel circuit of a resistor 21 and a capacitor 22 extends from the inverting input of the operation amplifier 16 to a connecting point which is supplied with the alternating voltage $U_{PULS}$. The voltage on the inverting input of the operation amplifier 16 is designated with $U_{NEG}$, while the voltage from the connecting point of the electromagnetic consumer 10 and the field effect transistor 11 to ground, that is, the voltage on the field effect transistor 11 itself is designated by the abbreviation $U_{DS}$.

A fixed potential is applied on the noninverting input of the operational amplifier 16 with the assistance of the two voltage divider resistors 18 and 19 and the stabilized voltage $U_{stab}$, thus forming the switch threshold for the switch-over of the operation amplifier 16. The voltage $U_{NEG}$ is available on the inverting input of the operation amplifier 16, being dependent from voltage $U_{DS}$ through resistor 17, as well as from voltage $U_{PULS}$ through the parallel circuit of the resistor 21 and the capacitor 22. If the voltage $U_{PULS}$ has a high potential the voltage $U_{NEG}$ is also high, so that the operation amplifier 16 switches off the field effect transistor 11.

Thus, no current flows through the electromagnetic consumer 10, the voltage $U_{DS}$ assumes a high value which stabilizes through the feedback resistor 17 the switched off operating condition of the operation amplifier 16 and of the field effect transistor 11. If, however, the voltage $U_{PULS}$ assumes a lower value, that means if $U_{PULS}$ jumps, for example, from $U_{stab}$ to ground potential, the voltage $U_{NEG}$ becomes immediatly smaller, so that the operation amplifier 16 switches on the field effect transistor 11. Now, a current flows through the electromagnetic consumer 10, the voltage $U_{DS}$ becomes small, so that again through the feedback resistor 17 the switched on operating condition of the operation amplifier 16 and of the field effect transistor 11 are maintained.

When the voltage $U_{PULS}$ changes from a high value to a lower value, consequently the field effect transistor 11 switches on, so that the electromagnetic consumer 10 is supplied with current. It is now assumed that the capacitor 22 is not present, that is, being an idling speed. Under this assumption the change of the voltage $U_{PULS}$ from a high to a low value would consequently result in that the voltage $U_{NEG}$ would drop from a high value to an average value, but would not fall below the switching threshold of the operation amplifier 16 defined by the voltage divider resistors 18 and 19. Therefore, without the capacitor 22 a changing of the voltage $U_{PULS}$ would not reverse the operation amplifier 16 and thereby not switch on the field effect transistor 11 and would therefore not generate a current flow through the electromagnetic consumer 10. However, if the capacitor 22 is present in the switching circuit, as illustrated in the FIGURE, consequently during a change in the voltage $U_{PULS}$ from a high to a lower value this lower value is fed for a short time through the capacitor 22 to the inverting input of the operation amplifier 16. Therefore, voltage $U_{NEG}$ has for a short time the lower value of voltage $U_{PULS}$. Thereby, it is made possible that the operation amplifier 16 switches over, the field effect transistor 11 is switched on, so that a current flows through the electromagnetic consumer 10. As already stated, the voltage $U_{DS}$ assumes a smaller value during a current flow through the electromagnetic consumer 10 which influences the inverting input of the operation amplifier 16 through the feedback resistor 17, and therefore holds the value of the voltage $U_{NEG}$ to a small value. Therefore, the capacitor 22 is absolutely necessary for switching on the field effect transistor 11 and must be so dimensioned that the field effect transistor 11 can be reliably switched on under normal operating conditions The change of the voltage $U_{PULS}$ from a lower value to a higher value, consequently causes the voltage $U_{NEG}$ to also assume a high value, so that the operation amplifier 16 switches off the field effect transistor 11. As already stated before, the absence of current through the electromagnetic consumer 10 generates a high value of the voltage $U_{DS}$ which stabilizes through the feedback resistor 17 the switched off operating condition of the operation amplifier 16 and the field effect transistor 11.

The diode 12 as well as the Zener diode 13 have the task to protect the field effect transistor 11 from the high voltage peeks during the switching off of the current through the electromagnetic consumer 10. Diode 20 is used for the signal limiting. Finally, the resistors 14 and 15 together with amplifier 16 have the task to control the field effect transistor 11.

In the normal operation of the described switch circuit the current flow is switched on and off through the electromagnetic consumer 10 with the assistance of the field effect transistor 11 in dependency from voltage $U_{PULS}$ through the forced switching on of capacitor 22. When the current through the electromagnetic consumer keeps increasing during normal operation, consequently the voltage $U_{DS}$ on the field effect transistor 11 also increases. This also causes an increase of the voltage $U_{NEG}$ on the inverting input of the operation amplifier 16 through feedback resistor 17. When the voltage $U_{NEG}$ exceeds the switching threshold of the operation amplifier 16 defined by the two voltage divider resistors 18 and 19, which corresponds to an increase of the current through the electromagnetic consumer 10 above a predetermined value defined by the resistors 18 and 19, the operation amplifier 16 switches off the field effect transistor 11 and thereby the current flow through the electromagnetic consumer 10. With the assistance of the dimensioning of the two voltage divider resistors 18 and 19 it is possible to limit the current flow through the electromagnetic consumer 10 to defined maximum values.

If suddenly a short circuit of the field effect transistor 11 occurs against the battery voltage $U_{Batt}$ in the normal operation of the described switch circuit when the field transistor 11 is switched on, the voltage $U_{DS}$ becomes equal to voltage $U_{Batt}$, consequently the voltage $U_{NEG}$ on the inverting input of the operation amplifier 16 also very rapidly assumes a high value through the feedback resistor 17 and thereby the operation amplifier 16 rapidly switches off the field effect transistor 11. Due to the high value of voltage $U_{DS}$, as previously described, the switched off operating condition of the operation amplifier 16 and the field effect transistor 11 is maintained by means of the feedback resistor 17. With the assistance of the described switching circuit it is possible to detect rapidly and reliably a short circuit of field effect transistor 11 against the battery voltage $U_{Batt}$ and to switch off the field effect transistor 11. Thereby, the time period from the occurence of the short circuit to the switching off of the field effect transistor 11 is defined, among others, by the capacitor 22, as is time period of the forceable switching on. Due to dimensioning specification for capacitor 22, as already described in conjunction with the forceable switching on, the delay time from the occurence of the short circuit to the switching off of the field effect transistor 11 is so small that an endangerment of the field effect transistors 11 is excluded.

Generally speaking, the switching circuit in accordance with the invention is a circuit which is provided with two operating conditions, namely "current flow" or "no current flow". Thereby, the operating condition "no current flow" is a stable operating condition which can only be changed forceably with the assistance of the forced switching on through capacitor 22. In contrast thereto, the operating condition "current flow" is an unstable operating condition which is maintained only under defined assumptions, namely $U_{PULS}$ is lower, and within defined limits, namely $U_{DS}$ and thereby the current flow is not too large. Therefore, the switch circuit in accordance with the invention is always within the so-called safe side, since during any given interferences the switching circuit transits very rapidly from the unstable condition into the stable operating condition.

We claim:

1. Switching circuit for controlling the current through an electrical consumer, in particular an electromagnetic consumer, comprising a current control member connected in series with the consumer to a power source, a comparing device for controlling said current control member, and resistance means connected between the junction point of said consumer with said current control member and said comparing device to enforce substantially without a time delay a blocking condition in said current control member when a short-circuit occurs between the current control member and the power source.

2. Switching circuit in accordance with claim 1, characterized in that the current control member is a field effect transistor.

3. Switching circuit in accordance with claim 1, characterized in that the current control member is a bipolar transistor.

4. Switching circuit in accordance with claim 1, wherein the current control member is used as a current measuring member.

5. Switching circuit in accordance with claim 1, wherein the electromagnetic consumer is a magnet valve for the fuel dosing into an internal combustion engine.

6. Switching circuit in accordance with claim 4 wherein said comparing device includes an operational amplifier having its non-inverting input connected to a source of constant voltage, and its inverting input connected via a parallel RC member to a source of a control signal, and said resistance means being connected to said inverting input.

7. Switching circuit in accordance with claim 6 wherein said control signal is a pulsating signal which at said inverting input is affected by said resistance means.

* * * * *